US010246615B2

(12) United States Patent
Nakayama et al.

(10) Patent No.: US 10,246,615 B2
(45) Date of Patent: Apr. 2, 2019

(54) ULTRAVIOLET-LIGHT-EMITTING DEVICE WITH ADHESIVE HAVING LOW GLASS TRANSITION TEMPERATURE

(71) Applicant: AGC, Inc., Chiyoda-ku (JP)

(72) Inventors: Fumiko Nakayama, Chiyoda-ku (JP); Yoshihiko Sakane, Chiyoda-ku (JP); Masahiro Ito, Chiyoda-ku (JP); Yuki Hatanaka, Chiyoda-ku (JP); Atsushi Koyanagi, Koriyama (JP)

(73) Assignee: AGC, Inc., Chiyoda-ku (JP)

( * ) Notice: Subject to any disclaimer, the term of this patent is extended or adjusted under 35 U.S.C. 154(b) by 0 days.

(21) Appl. No.: 15/401,772

(22) Filed: Jan. 9, 2017

(65) Prior Publication Data

US 2017/0114253 A1    Apr. 27, 2017

Related U.S. Application Data

(63) Continuation of application No. PCT/JP2015/070172, filed on Jul. 14, 2015.

(30) Foreign Application Priority Data

Jul. 15, 2014  (JP) .................................. 2014-144975

(51) Int. Cl.
*C09J 127/12* (2006.01)
*H01L 33/58* (2010.01)
(Continued)

(52) U.S. Cl.
CPC ........... *C09J 127/12* (2013.01); *C08F 216/14* (2013.01); *C09J 11/04* (2013.01); *C09J 11/06* (2013.01); *C09J 11/08* (2013.01); *H01L 33/58* (2013.01)

(58) Field of Classification Search
None
See application file for complete search history.

(56) References Cited

U.S. PATENT DOCUMENTS

| 2003/0134057 A1 | 7/2003 | Matsukura et al. |
| 2004/0048005 A1 | 3/2004 | Matsukura et al. |

(Continued)

FOREIGN PATENT DOCUMENTS

| JP | 1-131215 | 5/1989 |
| JP | 2-84456 | 3/1990 |

(Continued)

OTHER PUBLICATIONS

International Search Report dated Oct. 20, 2015 in PCT/JP2015/070172, filed on Jul. 14, 2015.

(Continued)

*Primary Examiner* — Daniel Whalen
(74) *Attorney, Agent, or Firm* — Oblon, McClelland, Maier & Neustadt, L.L.P.

(57) ABSTRACT

Provided is an adhesive for use in an ultraviolet-light-emitting device using ultraviolet light having a wavelength of from 200 to 400 nm as a light source, which can attach adherends made of a polymer having a fluorine-containing alicyclic structure with excellent adhesiveness which is unlikely to be impaired by exposure to such ultraviolet light or heat.

An adhesive for forming an adhesive joint in an ultraviolet-light-emitting device, which is either the following adhesive (A) or the following adhesive (B) comprising a fluoropolymer having a fluorine-containing alicyclic structure:

the adhesive (A): an adhesive in which the glass transition temperature of the fluoropolymer is from 30 to 100° C., and which does not contain an ultraviolet-shielding agent; and (Continued)

the adhesive (B): an adhesive comprising the fluoropolymer and an ultraviolet-shielding agent.

13 Claims, 2 Drawing Sheets

(51) Int. Cl.
    *C08F 216/14*     (2006.01)
    *C09J 11/04*     (2006.01)
    *C09J 11/06*     (2006.01)
    *C09J 11/08*     (2006.01)

(56) References Cited

U.S. PATENT DOCUMENTS

| | | |
|---|---|---|
| 2004/0142286 A1 | 7/2004 | French et al. |
| 2005/0147897 A1 | 7/2005 | Matsukura et al. |
| 2009/0118429 A1* | 5/2009 | Sugiyama ............. C08F 214/18 525/199 |
| 2012/0063952 A1 | 3/2012 | Hong et al. |
| 2013/0234274 A1* | 9/2013 | Kam ....................... H01L 33/58 257/432 |

FOREIGN PATENT DOCUMENTS

| | | |
|---|---|---|
| JP | 2526641 | 8/1996 |
| JP | 2748432 | 5/1998 |
| JP | 2000-103812 A | 4/2000 |
| JP | 2001-226313 A | 8/2001 |
| JP | 2001-330943 | 11/2001 |
| JP | 2004-536171 | 12/2004 |
| JP | 2006-93372 | 4/2008 |
| JP | 2013-542096 | 11/2013 |
| TW | 200408665 A | 6/2004 |
| WO | WO 2012/033626 A2 | 3/2012 |

OTHER PUBLICATIONS

Office Action dated Jan. 17, 2019 issued in corresponding Taiwanese patent application No. 104122733.

\* cited by examiner

ULTRAVIOLET-LIGHT-EMITTING DEVICE WITH ADHESIVE HAVING LOW GLASS TRANSITION TEMPERATURE

This application is a continuation of PCT Application No. PCT/JP2015/070172 filed on Jul. 14, 2015, which is based upon and claims the benefit of priority from Japanese Patent Application No. 2014-144975 filed on Jul. 15, 2014. The contents of those applications are incorporated herein by reference in their entireties.

TECHNICAL FIELD

The present invention relates to an adhesive for use in an ultraviolet-light-emitting device using ultraviolet light having a wavelength from 200 to 400 nm as a light source.

BACKGROUND ART

In recent years, light emitting diodes (hereinafter referred to as "LEDs") emitting ultraviolet light having a wavelength from 200 to 400 nm are used for medical sterilization, sensors and the like. For example, LEDs having a substrate, a light-emitting chip mounted on the substrate surface, a support frame mounted around the light-emitting chip on the substrate and an optical member (such as a lens or a transparent pane) placed above the light emitting chip to close the opening of the support frame are known. The support frame and the optical member are usually bonded by an adhesive.

Optical members used for LEDs emitting ultraviolet light having a wavelength of at most 400 nm are required to be transparent and resistant to ultraviolet light having a wavelength of not more than 400 nm. Hence, quartz is usually used as the material for such optical members. However, quartz is shaped into lenses and the like by laser beam machining because injection molding of quartz is difficult due to its high glass transition temperature. Hence, production efficiency of quartz optical members is low. Therefore, some techniques were proposed for making lenses and other optical members from polymers having a fluorine-containing alicyclic structure (Patent Documents 1 and 2). Polymers having a fluorine-containing alicyclic structure melt at lower temperatures than quartz and, hence, are easily processed by melt molding and the like. They are highly transparent and resistant to ultraviolet light having a wavelength of 400 nm or less.

Polymers having a fluorine-containing alicyclic structure are proposed for use m adhesives for optical members, too.

For example, Patent Document 2 proposes use of a fluoropolymer which is a homopolymer selected from a specific group A or a copolymer selected from specific groups B, C and D, as a component of an adhesive composition.

In Patent Document 3, an adhesive containing a polymer obtained by cyclization polymerization of perfluoroallyl vinyl ether or perfluorobutenyl vinyl ether for bonding quartz lenses.

PRIOR ART DOCUMENTS

Patent Document 1: Japanese Patent No. 2528641
Patent Document 2: JP-A-2004-536171
Patent Document 3: JP-A-H02-84456

DISCLOSURE OF THE INVENTION

Technical Problem

An adhesive joint formed from the adhesive disclosed in Patent Document 2 does not stick to an optical member firmly enough, and the optical member can come off the substrate. The fluoropolymer contains —$CH_2$— in the main chain and, hence, does not have sufficient resistance to ultraviolet light having a wavelength of 400 nm or less or to heat. When exposed to light ultraviolet light having a wavelength of 400 nm or less or heat for a long time, the fluoropolymer deteriorates and decomposes, generating acidic decomposition gases such as HF which can corrosively damage peripheral equipment.

According to the present inventors, the adhesive disclosed in Patent Document 3 does not stick to some types of optical elements and members sufficiently firmly.

The object of the present invention is to provide an adhesive for ultraviolet-light-emitting devices using ultraviolet light having a wavelength from 200 to 400 nm as a light source, which can attach adherends made of a polymer having a fluorine-containing alicyclic structure with excellent adhesiveness which is unlikely to be impaired by exposure to such ultraviolet light or heat.

Another object of the present invention is to provide an ultraviolet-light-emitting device using ultraviolet light having a wavelength from 200 to 400 nm as a light source, having a member made of a polymer having a fluorine-containing alicyclic structure bonded with excellent adhesiveness which is unlikely to be impaired by exposure to such ultraviolet light or heat.

Solution to Problem

The present invention provides an adhesive for ultraviolet-light-emitting devices and an ultraviolet-light-emitting device having the following features [1] to [14].

[1] An adhesive for forming an adhesive joint in the following ultraviolet-light-emitting device, which is either the following adhesive (A) or the following adhesive (B) comprising a fluoropolymer having a fluorine-containing alicyclic structure:

the ultraviolet-light-emitting device: an ultraviolet-light-emitting device comprising a light-emitting element generating ultraviolet light having a wavelength from 200 to 400 nm, an optical member which transmits the ultraviolet light generated by the light-emitting element and an adhesive joint formed from the adhesive between the light-emitting element and the optical member;

the adhesive (A): an adhesive in which the glass transition temperature of the fluoropolymer is from 30 to 100° C., and which does not contain an ultraviolet-shielding agent; and the adhesive (B): an adhesive comprising the fluoropolymer and an ultraviolet-shielding agent.

[2] The adhesive according to [1], wherein the glass transition temperature of the fluoropolymer in the adhesive (B) is from 30 to 100° C.

[3] The adhesive according to [1] or [2], wherein the adhesive (B) contains the ultraviolet-shielding agent in an amount from 0.1 to 20 mass % based on the fluoropolymer.

[4] The adhesive according to any one of [1] to [3], wherein the ultraviolet-shielding agent comprises at least one member selected from the group consisting of inorganic particles and organic particles.

[5] The adhesive according to any one of [1] to [4], wherein the fluoropolymer has a reactive functional group in a side chain or at the end of the main chain and has no hydrogen atoms bonded to a carbon atom anywhere other than the reactive functional group.

[6] The adhesive according to any one of [1] to [5], wherein the optical member is so made of a fluoropolymer having a fluorine-containing alicyclic structure.

[7] The adhesive according to [6], wherein the glass transition temperature of the fluoropolymer in the optical member is equal to or higher than the glass transition temperature of the fluoropolymer in the adhesive.

[8] The adhesive according to [6] or [7], wherein the glass transition temperature of the fluoropolymer in the optical member is from 100 to 180° C.

[9] The adhesive according to any one of [1] to [8], wherein the fluoropolymer having a fluorine-containing alicyclic structure has a unit (a) having a fluorine-containing alicyclic structure.

[10] The adhesive according to [9], wherein at least one of the ring-constituting carbon atoms in the fluorine-containing alicyclic ring is in the polymer main chain.

[11] The adhesive according to [9] or [10], wherein the unit (a) has no hydrogen atoms bonded to a carbon atom.

[12] The adhesive according to any one of [9] to [11], wherein the unit (a) is formed by cyclization polymerization of a fluorine-containing diene monomer.

[13] The adhesive according to any one of [9] to [12], wherein the fluoropolymer having a glass transition temperature from 30 to 100° C. comprises the unit (a) and a unit (b) represented by the following formula (b), and the total content of the unit (a) and the units (b) is from 50 to 100 mol % based on the total of all units:

(b)

(wherein $R^f$ is a perfluoroalkylene group which may have an ethereal oxygen atom, X is COOH, COOR, $SO_2F$, $SO_3R$ or $SO_3H$, and R is a $C_{1-5}$ alkyl group).

[14] An ultraviolet-light-emitting device comprising a light-emitting element generating ultraviolet light having a wavelength from 200 to 400 nm and an optical member which transmits ultraviolet light having a wavelength from 200 to 400 nm, wherein the light-emitting element and the optical member are bonded together by an adhesive joint formed from the adhesive as defined in any one of [1] to [13].

Advantageous Effects of Invention

The adhesive for ultraviolet-light-emitting devices of the present invention is used for ultraviolet-light-emitting devices using ultraviolet light of a wavelength from 200 to 400 nm and hold together adherends made of a fluoropolymer having a fluorine-containing alicyclic structure with excellent adhesiveness which is unlikely to be impaired by exposure to such ultraviolet light or heat.

The ultraviolet-light-emitting device of the present invention has an adherend made of a fluoropolymer having a fluorine-containing alicyclic structure bonded with excellent adhesiveness which is unlikely to be impaired by exposure to such ultraviolet light having a wavelength from 200 to 400 nm or heat.

DESCRIPTION OF EMBODIMENTS

Figure 1:
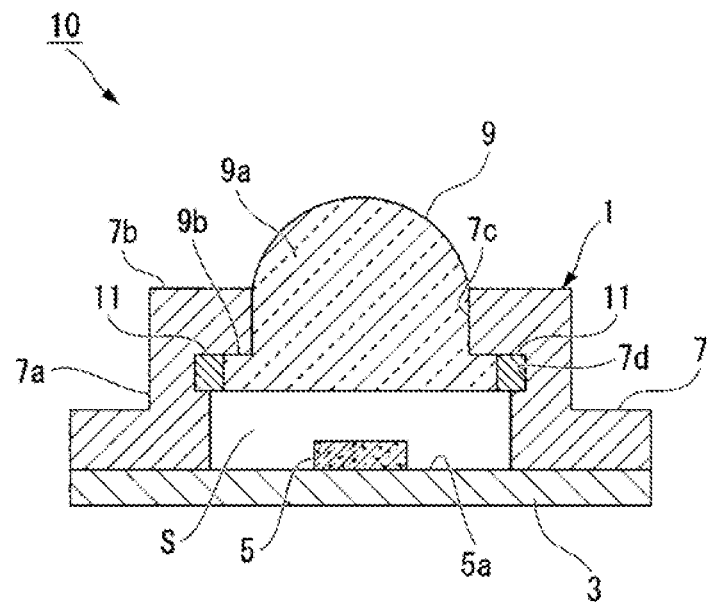
FIG. 1 A schematic sectional view of an embodiment of the ultraviolet-light-emitting device of the present invention.

The following definitions of the terms apply to the entire description and the claims.

A "unit" of a polymer is part of the polymer derived from a monomer by polymerization of the polymer. A unit may be formed directly by polymerization or may be formed by chemically converting part of a unit of a polymer obtained by polymerization into a different structure.

A "fluorine-containing alicyclic structure" means an alicyclic structure having at least one ring-constituting carbon atom bonded to a fluorine atom or a fluorine-containing group in the ring skeleton. As the fluorine-containing group, a perfluoroalkyl group, a perfluoroalkoxy group, a $=CF_2$ group or the like may be mentioned. At least one of the carbon atoms constituting the ring skeleton may be bonded to a substituent other than the fluorine-containing group.

An "alicyclic structure" means a none-aromatic saturated or unsaturated ring structure.

An "ethereal oxygen" is an oxygen atom between carbon atoms (—C—O—C—).

A "perfluoroalkyl group" is a group obtained by replacing all the hydrogen atoms in an alkyl group with fluorine atoms. A "perfluoroalkylene group" is a group obtained by replacing all the hydrogen atoms in an alkylene group with fluorine atoms.

A "perfluoropolymer" is a fluorine-containing polymer having no hydrogen atoms bonded to a carbon atom.

A "glass transition temperature" (hereinafter referred to also as "$T_g$") is a midway glass transition temperature ($T_{mg}$) measured in accordance with JIS K 7121: 2012 edition.

Herein, a compound represented by the formula (1) is also referred to as a "compound (1)", and a unit represented by the formula (1) is also referred to as a "unit (1)". The same applies to compounds and units and the like represented by other formulae.

[Adhesive]

The adhesive of the present invention is used to form an adhesive joint in the following ultraviolet-light-emitting device and is either the following adhesive (A) or (B) comprising a fluoropolymer having a fluorine-containing alicyclic structure:

the ultraviolet-light-emitting device: an ultraviolet-light-emitting device comprising a light-emitting element generating ultraviolet light having a wavelength from 200 to 400 nm, an optical member which transmits the ultraviolet light generated by the light-emitting element and an adhesive joint formed from the adhesive between the light-emitting element and the optical member;

the adhesive (A): an adhesive in which the glass transition temperature of the fluoropolymer is from 30 to 100° C., and which does not contain an ultraviolet-shielding agent; and the adhesive (B): an adhesive comprising the fluoropolymer and an ultraviolet-shielding agent.

The light-emitting element may be an LED element, a semiconductor laser, a low-pressure mercury vapor lamp, a high-pressure mercury vapor lamp, a metal halide lamp, a xenon lamp or the like. The optical member may be a lens, an optical fiber, a translucent pane, a prism, a light guide plate, a resin fiber, an optical mirror, a diffraction grating or the like. It is preferred that the whole or at least the surface of the optical member in contact with the adhesive joint is made of a fluoropolymer. The surface of the light-emitting element in contact with the adhesive joint may be made of a fluoropolymer as well. Such a fluoropolymer which constitutes the light-emitting element or the optical member is referred to as the "polymer (I)" hereinafter.

The surfaces of the light-emitting element and the optical member in contact with the adhesive joint are made of various members. As the material which forms these surfaces, a fluoropolymer having a fluorine-containing alicyclic structure is preferred because of its excellent optical properties and high affinity for the adhesive joint.

(Adhesive A)

The adhesive (A) comprises a fluoropolymer having a fluorine-containing alicyclic structure and a glass transition temperature from 30 to 100° C. (herein after referred to also as the "polymer (II)"). The adhesive (A) may further comprises other components than the polymer (II) and an ultraviolet-shielding agent, if required. The adhesive (A) may further contain a solvent, if required.

Upon baking at a temperature at or lower than the $T_g$ of the polymer (II) in the adhesive (A), the polymer (II) becomes less viscous and fills the irregularities on the surface of the light-emitting element or the optical member to produce anchor effect.

Introduction of a reactive functional group such as a carboxy group or an alkoxycarbonyl group at the end of the main chain of a polymer having a fluorine-containing alicyclic structure has already been proposed to improve the adhesiveness with other materials. These reactive functional groups are effective in improving initial adhesiveness, but when exposed to ultraviolet light having a wavelength from 200 to 400 nm, they decompose, losing their effect of improving adhesiveness. However, the adhesive (A) sticks to adherends made of other materials through physical action such as anchor effect and maintains the excellent adhesiveness even when reactive functional groups decompose upon exposure to ultraviolet light having a wavelength from 200 to 400 nm.

(Polymer (II))

The polymer (II) preferably is a polymer having the following unit (a) and the following unit (b) and may further contain a unit other than the unit (a) and unit (b) (hereinafter referred to as "unit (c)"). The unit (a) imparts excellent affinity for the surface of the optical member made of the after-mentioned polymer (I) to the polymer (II). The unit (b) provides a reactive functional group which undergoes a chemical reaction with a material constituting the light-emitting element or the light-emitting member to the polymer (II) and thereby, the presence of the unit (b) leads to excellent initial adhesiveness with the light-emitting element or the optical member.

It is preferred that the polymer (II) has a reactive functional group which strengthens adhesiveness, but the rest of polymer is a perfluoropolymer. Therefore, it is preferred that all the units in the polymer (II) except units derived from a monomer having a reactive functional group are units derived from a perfluoromonomer (a fluorine-containing monomer having no hydrogen atoms bonded to a carbon atom (hereinafter referred to as "perfluoro units"). It is preferred that the units derived from a fluorine-containing monomer having a functional group have no hydrogen atoms bonded to a carbon atom anywhere other than the reactive functional group (such as X in the unit (b)).

The reactive functional group will be described later.

<Unit (a)>

The unit (a) is a unit having a fluorine-containing alicyclic structure.

The unit (a) is preferably a perfluoro unit.

The fluorine-containing alicyclic ring in the fluorine-containing alicyclic structure may have a carbocyclic structure having only carbon atoms in the ring skeleton or a heterocyclic structure containing a non-carbon atom (hetero atom) in the ring skeleton. The hetero atom may be an oxygen atom, a nitrogen atom or the like.

The ring skeleton of the fluorine-containing alicyclic ring preferably consists of 4 to 7 ring-constituting atoms, particularly preferably 5 or 6 ring-constituting atoms. Namely, the alicyclic ring is preferably a 4- to 7-membered ring, particularly preferably a 5- or 6-membered ring.

The fluorine-containing alicyclic structure may be in the main chain or in the side chain of the polymer (II), but preferably in the main chain of the polymer (II) because the adhesive joint would have excellent mechanical strength and chemical stability.

A fluorine-containing alicyclic structure "in the main chain" means that at least one of the ring-constituting carbon atoms in the fluorine-containing alicyclic structure is in the main chain of the polymer. This does not necessarily means that both of the two carbon atoms derived from a polymerizable double bond are in the polymer main chain, but means that one or neighboring two ring-constituting atoms in the fluorine-containing alicyclic structure are derived from a polymerizable double bond.

For example, when the unit (a) is formed by addition polymerization of a monoene monomer, both of the two carbon atoms derived from the polymerizable double bond are in the main chain, and the ring skeleton contains both of the two carbon atoms as neighboring ring-constituting atoms or either of the two carbon atoms as a ring-constituting atom. When the unit (a) is formed by cyclization polymerization of a diene monomer, the total of four carbon atoms derived from the two polymerizable double bond are in the main chain and the ring skeleton contains from 2 to 4 of the four carbon atoms as ring-constituting carbon atoms.

A unit (a) having a fluorine-containing alicyclic structure in the main chain is formed by cyclization polymerization of a fluorine-containing diene monomer or derived from a cyclic fluorine-containing monomer.

A fluorine-containing diene monomer is a monomer having two polymerizable double bonds and fluorine atom(s). A fluorine-containing diene monomer forms a unit (a) upon cyclization polymerization.

The polymerizable double bonds are preferably vinyl groups, allyl groups, acryloyl groups or methacryloyl groups, though there are no particular restrictions, in these polymerizable double bonds, all or some of the hydrogen atoms attached to carbon atoms may be replaced by fluorine atoms.

As the fluorine-containing diene monomer, the following compound (ma1) is preferred.

$$CF_2=CF-Q-CF=CF_2 \quad \text{(ma1)}$$

(wherein Q is a $C_{1-6}$ perfluoroalkylene group in which some of the fluorine atoms may be replaced by other halogen atoms and which may have an ethereal oxygen atom.)

In the formula (ma1), the number of carbon atoms in the perfluoroalkylene group as Q is from 1 to 6, preferably from 1 to 5, particularly preferably from 1 to 3. The perfluoroalkylene group is preferably linear or branched, particularly preferably linear.

Some of the fluorine atoms in the perfluoroalkylene group may be replaced by halogen atoms other than fluorine atoms, such as chlorine atoms or bromine atoms.

The perfluoroalkylene group may have an ethereal oxygen atom.

Q is preferably a perfluoroalkylene group having an ethereal oxygen atom. In this case, the perfluoroalkylene group may have an ethereal oxygen atom at either end, ethereal oxygen atoms at both ends or an ethereal oxygen atom between carbon atoms, and preferably has an ethereal oxygen atom at either end considering ease of cyclization polymerization.

Q is preferably a group represented by the following formula (q-1) or the following formula (q-2).

$$—(CR^1R^2)_h— \qquad (q\text{-}1)$$

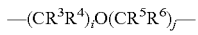

$$—(CR^3R^4)_iO(CR^5R^6)_j— \qquad (q\text{-}2)$$

(wherein each of $R^1$, $R^2$, $R^3$, $R^4$, $R^5$ and $R^6$ is independently a fluorine atom, a chlorine atom, a trifluoromethyl group or a trifluoromethoxy group, h is an integer from 2 to 4, a plurality of $R^1$'s or $R^2$'s may be identical or different, each of i and j is an integer from 0 to 3, i+j is an integer from 1 to 3, and when i is 2 or 3, a plurality of $R^3$'s or $R^4$'s may be identical or different, and when j is 2 or 3, a plurality of $R^5$'s or $R^6$'s may be identical or different).

h is preferably 2 or 3, and it is preferred that all $R^1$'s and $R^2$'s are fluorine atoms with the exception of one or two. It is preferred that i is 0, and j is 1 or 2. It is preferred that all $R^5$'s and $R^6$'s are fluorine atoms with the exception of one or two.

Specific examples of the compound (ma1) include the following compounds.

$$CF_2{=}CFOCF_2CF{=}CF_2,$$

$$CF_2{=}CFOCF(CF_3)CF{=}CF_2,$$

$$CF_2{=}CFOCF_2CF_2CF{=}CF_2,$$

$$CF_2{=}CFOCF_2CF(CF_3)CF{=}CF_2,$$

$$CF_2{=}CFOCF(CF_3)CF_2CF{=}CF_2,$$

$$CF_2{=}CFOCFClCF_2CF{=}CF_2,$$

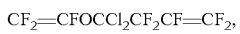

$$CF_2{=}CFOCCl_2CF_2CF{=}CF_2,$$

$$CF_2{=}CFOCF_2CF{=}CF_2,$$

$$CF_2{=}CFOC(CF_3)_2OCF{=}CF_2,$$

$$CF_2{=}CFOCF_2CF(OCF_3)CF{=}CF_2,$$

$$CF_2{=}CFCF_2CF_2CF_2,$$

$$CF_2{=}CFCF_2CF_2CF{=}CF_2, \text{ and}$$

$$CF_2{=}CFCF_2OCF_2CF{=}CF_2.$$

The fluorine-containing cyclic monomer may be a monomer having a fluorine-containing alicyclic ring having a polymerizable double bond between ring-constituting carbon atoms in the fluorine-containing ring or a monomer having a fluorine-containing alicyclic ring and having a polymerizable double bond between a ring-constituting carbon atom in the fluorine-containing alicyclic ring and a carbon atom outside the fluorine-containing ring.

The fluorine-containing cyclic monomer is preferably the following compound (ma2) or (ma3).

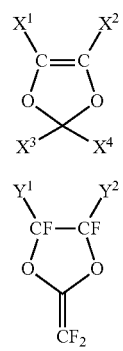

(ma2)

(ma3)

(wherein each of $X^1$, $X^2$, $X^3$, $X^4$, $Y^1$ and $Y^2$ is independently a fluorine atom, a perfluoroalkyl group which may have an ethereal oxygen atom or a perfluoroalkoxy group which may have an ethereal oxygen atom, and $X^3$ and $X^4$ may be bonded to each other to form a ring.)

In the formulae (ma2) and (ma3), the perfluoroalkyl group as $X^1$, $X^2$, $X^3$, $X^4$, $Y^1$ or $Y^2$ has preferably from 1 to 7 carbon atoms, more preferably from 1 to 5 carbon atoms, particularly preferably from 1 to 4 carbon atoms. The perfluoroalkyl group is preferably linear or branched, particularly preferably linear. The perfluoroalkyl group is preferably a trifluoromethyl group, a pentafluoromethyl group, a heptafluoropropyl group or the like, particularly preferably a trifluoromethyl group.

The perfluoroalkoxy group as $X^1$, $X^2$, $X^3$, $X^4$, $Y^1$ or $Y^2$ is such a perfluoroalkyl group as mentioned above which is bonded to an oxygen atom (—O—) and is particularly preferably a trifluoromethoxy group.

When the perfluoroalkyl group or the perfluoroalkoxy group has two or more carbon atoms, the perfluoroalkyl group or the perfluoroalkoxy group may have an ethereal oxygen atom (—O—) between carbon atoms.

In the formula (ma2), $X^1$ is preferably a fluorine atom.

$X^2$ is preferably a fluorine atom, a trifluoromethyl group or a $C_{1-4}$ perfluoroalkoxy group, particularly preferably a fluorine atom or a trifluoromethoxy group.

Each of $X^3$ and $X^4$, which are independent of each other, is preferably a fluorine atom or a $C_{1-4}$ perfluoroalkyl group, particularly preferably a fluorine atom or a trifluoromethyl group.

$X^3$ and $X^4$ may be bonded to each other to form a ring constituted by preferably from 4 to 7 atoms, particularly preferably from 5 to 8 atoms.

In the formula (ma3), each of $Y^1$ and $Y^2$, which are independent of each other, is a fluorine atom, a $C_{1-4}$ perfluoroalkyl group or a $C_{1-4}$ perfluoroalkoxy group, particularly preferably a fluorine atom or a trifluoromethoxy group.

Preferred examples of the compound (m2) are compounds (m21) to (m25).

Preferred examples of the compound (ma3) are compounds (ma31) to (ma32).

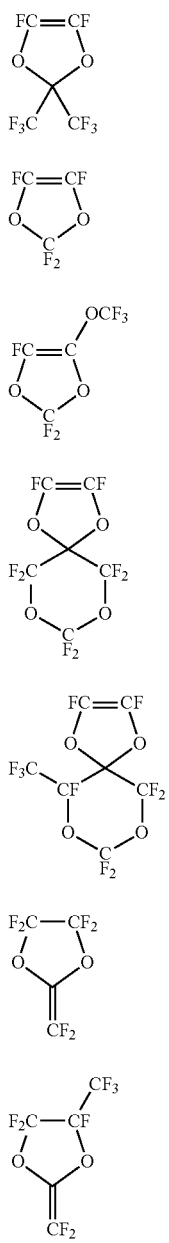

(ma21)

(ma22)

(ma23)

(ma24)

(ma25)

(ma31)

(ma32)

The unit (a) is preferably at feast one selected from the group consisting of the following units (a1) to (a6).

The units (a1) to (a4) are units derived from the compound (ma1) by cyclization polymerization, and cyclization polymerization of the compound (ma1) gives at least one of the units (a1) to (a4). Among the units (a1) to (a4), those having a 5- or 6-membered alicyclic ring are easy to obtain, and the resulting polymer can contain two or more of these units. In other words, preferred compound (ma1) are those which give the following units (a1) to (a4) having a 5- or 6-membered ring containing Q.

The following unit (a5) is a unit derived from the compound (ma2); and the following unit (a6) is a unit derived from the compound (ma3).

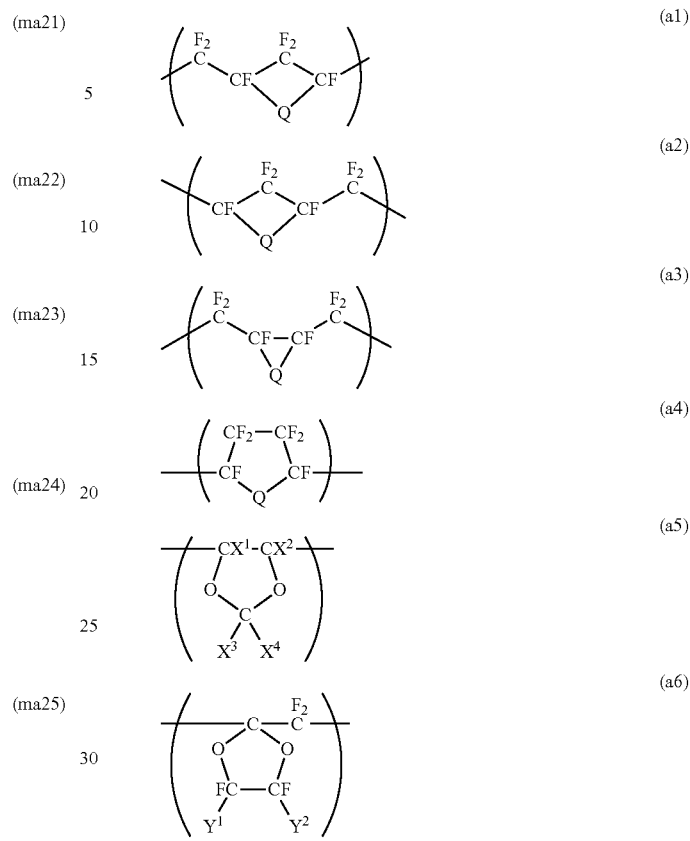

As the unit (a), a unit formed by cyclization polymerization of a fluorine-containing diene monomer is preferred because such a unit (a) imparts high affinity for an optical member made of the after-mentioned polymer (I) to be bonded to a light-emitting element and excellent chemical stability, to the polymer (II).

The polymer (II) may contain one or more kinds of unit (a).

<Unit (b)>

The units (b) are represented by the following formula (b):

(wherein $R^f$ is a perfluoroalkylene group which may have an ethereal oxygen atom, X is COOH, COOR, $SO_2F$, $SO_3R$ or $SO_3H$, and R is a $C_{1-5}$ alkyl group).

In the formula (b), the perfluoroalkylene group as $R^f$ is preferably linear or branched, and the number of carbon atoms in the perfluoroalkylene group is preferably from 2 to 10, more preferably from 2 to 7, particularly preferably from 2 to 5.

The perfluoroalkylene group may have an ethereal oxygen atom. The number of ethereal oxygen atoms in the perfluoroalkyl group may be 1 or at least 2.

Specific examples of $R^f$ are given below.

$-CF_2CF_2CF_2-$, $-CF_2CF(CF_3)OCF_2CF_2-$, $-CF_2CF_2CF(CF_3)OCF_2CF_2-$, $CF_2CF(CF_3)OCF_2CF_2CF_2-$.

The alkyl group as R in COOR or $SO_3R$ is preferably linear or branched. The alkyl group is preferably a $C_{1-6}$ alkyl group, particularly preferably a methyl group.

X is preferably $COOCH_3$, $SO_2F$ COOH or $SO_3H$.

$-O-R^f-X$ in the units (b) is preferably represented by any of the following formulae.

$-OCF_2CF(CF_3OCF_2CF_2COOCH_3$, $-OCF_2CF_2CF_2COOCH_3$, $-OCF_2CF(CF_3)OCF_2CF_2SO_2F$, $-OCF_2CF_2CF_2COOH$, $-OCF_2CF(CF_3)OCF_2CF_2CF_2COOCH_3$, $-OCF_2CF(CF_3)OCF_2CF_2SO_3H$.

The polymer (II) may contain one or more kinds of unit (b).

The unit (b) can be formed by polymerizing $CF_2=CF-O-R^f-X$.

<Unit (c)>

The unit (c) is a unit other than the units (a) and (b).

The unit (c) may be derived from any monomer which is copolymerizable with monomers which form the units (a) and (b) without particular restrictions and may be, for example, a unit derived from a monomer having a polymerizable double bond and a reactive functional group (other than the unit (b)) (hereinafter referred to as "unit (c1)") a unit derived from a fluorine-containing olefin such as tetrafluoroethylene or a unit derived from a fluorine-containing vinyl ether.

As the polymerizable double bond, $CF_2=CF-$, $CF_2=CH-$, $CH_2=CF-$, $CFH=CF-$, $CFH=CH-$, $CF_2=C<$, $-CF=CF-$ and the like may be mentioned.

The unit (c) is preferably a perfluoro unit except for the unit (c1). When the unit (c) is the unit (c1), it is preferred that it does not have hydrogen atoms bonded to a carbon atom anywhere other than the reactive functional group.

<Composition>

The total content of the units (a) and (b) in the polymer (II) is from 50 to 100 mol %, preferably from 75 to 100 mol %, particularly preferably from 85 to 100 mol %, based on all the units constituting the polymer (II). When the total content of the units (a) and (b) is at or above the above-mentioned lower limit, the polymer (II) has excellent affinity for an adherend made of the polymer (I), and the adhesiveness between the adhesive joint formed from the adhesive and the adherend made of the polymer (I) is excellent.

The molar ratio (a/b) of the unit (a) to the unit (b) in the polymer (II) is preferably from 70/30 to 99/1, particularly preferably from 80/20 to 99/1. When the a/b is within the above-mentioned range, the polymer (II) is likely to have a $T_g$ within the after-mentioned range. When the a/b is at or above the lower limit of the above-mentioned range, the polymer (II) has excellent affinity for an adherend made of the polymer (I), and the adhesiveness between the adhesive joint formed from the adhesive and the adherend made of the polymer (I) is excellent. When the a/b is at or below the upper limit of the above-mentioned range, better initial adhesiveness (immediately after adhesion) with an adherend made of a material other than the polymer (I) (such as a metal or an alloy) is obtained.

<Reactive Functional Group>

A reactive functional group means a reactive group which can react upon baking to form a chemical bond (such as a hydrogen bond or a covalent bond) between polymer molecules having such the functional group or with materials other than such a polymer (such as metals or alloys).

As the reactive functional group, a carboxyl group, an acid halide group, an alkoxycarbonyl group, a carbonyloxy group, a carbonate group, a sulfo group, a phosphono group, a hydroxy group, a thiol group, a silanol group or the like may be mentioned.

As the functional group, the polymer (II) has at least the functional group in the unit (b) (X in $-O-R^f-X$).

The polymer (II) may optionally have an additional reactive functional group other than that in the units (b). Such an additional reactive group may be bonded to an end of the main chain of the polymer (II) or in the side chain. For example, in the case of a unit (c1), the additional functional group is present in the side chain.

<$T_g$>

The $T_g$ of the polymer (II) (hereinafter referred to also as "$T_g^{II}$") is from 30 to 100° C., preferably from 40 to 95° C., particularly preferably from 60 to 90° C.

When the $T_g^{II}$ is at or below the upper limit of the above-mentioned range, the adhesive joint has excellent tacking property, and during baking for bonding an adherend made of the polymer (I) or other materials (for example, at 100° C. or above), the adhesive becomes less viscous and fills the irregularities on the surface of the adherend to produce anchor effect between the adhesive joint and the adherend. The tacking property and the anchor effect help achieve excellent adhesiveness between the adherend and the adhesive joint. The adhesiveness is attributed to physical interactions (tacking property and anchor effect) and hence resists exposure to ultraviolet light having a wavelength from 200 to 400 nm.

If the $T_g^{II}$ is at or above the lower limit of the above-mentioned range, the resulting adhesive joint will have the heat resistance and the heat cycle resistance necessary for parts of light-emitting devices such as LEDs to have. For example, the adhesive joint is unlikely to melt or lose hold of the member bonded to it even at high temperatures of 80° C. or above or during a heat cycle between −40° C. and 80° C.

The $T_g^{II}$ is preferably not only within the above-mentioned range but also not higher than the $T_g$ of the polymer (I) (hereinafter referred to also as "$T_g^I$"), more preferably between ($T_g^I$-50° C.) and $T_g^I$, particularly preferably between ($T_g^I$-50° C.) and ($T_g^I$-10° C.). When $T_g^{II}$ is the same as or lower than $T_g^I$, the polymer (II) has good affinity for the surface of an optical member made of the polymer (I) to be bonded to a light-emitting element, and the adhesiveness between the adhesive joint formed from the adhesive and the optical member made of the polymer (I) is excellent.

The $T_g^{II}$ can be adjusted by changing the content of the unit (b) or the type of the unit (a) in the polymer (II). For example, the $T_g^{II}$ tends to increase as the content of the unit (b) increases. The $T_g^{II}$ tends to be lower when the unit (a) is the unit (a1) or (a2) than when the unit (a) is the unit (a3).

<Molecular Weight>

The mass average molecular weight of the polymer (II) is preferably from 10,000 to 150,000, more preferably from 30,000 to 130,000, particularly preferably form 30,000 to 120,000. When the mass average molecular weight of the polymer (II) is at the lower limit of the above-mentioned range or above, the adhesive joint has high mechanical strength, and when it is at the upper limit of the above-mentioned range or below, the polymer (II) dissolves well in solvent.

The average molecular weight of the polymer (II) can be measured by gel filtration chromatography.

The content of the polymer (II) in the adhesive (A) is preferably at least 50 mass %, more preferably at least 70 mass %, particularly preferably at least 80 mass %, based on the solid in the adhesive (A). When the content of the polymer (II) is at the lower limit of the above-mentioned range or above, the polymer (II) has high affinity for the surface of an optical member made of the polymer (I) to be bonded to a light-emitting element, and the adhesiveness between the adhesive joint and the optical member made of the polymer (I) is excellent.

The upper limit of the content of the polymer (II) based on the solid in the adhesive (A) may be 100 mass % without particular restrictions, it can be set appropriately depending on the content of optional components other than the ultraviolet-shielding agent.

The solid content of the adhesive (A) may be arbitrarily adjusted according to the coating method, the thickness of the coating to be formed and the like, and is preferably from 1 to 30 mass %, particularly preferably from 1 to 20 mass %.
(Other Components)

Components other than the polymer (II) and the ultraviolet-shielding agent are not particularly restricted, as long as they do not spoil the effect of the present invention. They may be, for example, a $SiO_2$, $ZrO_2$ or $TiO_2$ sol for increasing refractive index, an aminosilane or epoxysilane for improving adhesiveness and the like and may be used alone or in combination of two or more.

Components other than the polymers (I) to (III) and the solvent and the ultraviolet-shielding agent are referred to as "other components".

The content of other components in the material (A) may be adjusted arbitrarily according to their types, as long as they do not spoil the effect of the present invention.
(Solvent)

A solvent which dissolves at least the polymer (II) is used in the material (A). When the material (A) contains at least one ultra violet-shielding agent selected from the group consisting of inorganic particles and organic particles, the solvent to be used to dissolve the polymer (II) may serve as a dispersion medium for the ultraviolet-shielding agent.

The solvent may be a protic solvent or an aprotic solvent. A "protic solvent" is capable of acting as a proton donor, while an "aprotic solvent" is incapable of acting a proton donor.

Protic solvents include the following fluorine-free protic solvents and fluorine-containing protic solvents.

Fluorine-free protic solvents such as methanol, ethanol, 1-propanol, isopropyl alcohol, 1-butanol, 2-butanol, t-butanol, pentanol, hexanol, 1-octanol, 2-octanol, ethylene glycol, ethylene glycol monomethyl ether, propylene glycol monomethyl ether, propylene glycol monobutyl ether, propylene glycol and methyl lactate.

Fluorine-containing protic solvents such as fluorine-containing alcohols like 2-(perfluorooctyl)ethanol, fluorine-containing carboxylic acids, amides of fluorine-containing carboxylic acids and fluorine-containing sulfonic acids.

Aprotic solvents include the following fluorine-free aprotic solvents and fluorine-containing aprotic solvents.

Fluorine-free aprotic solvents such as hexane, cyclohexane, heptane, octane, decane, dodecane, decalin, acetone, cyclohexanone, 2-butanone, dimethoxyethane, monomethyl ether, ethyl acetate, butyl acetate, diglyme, triglyme, propylene glycol monomethyl ether monoacetate (PGMEA), N,N-dimethylformamide (DMF), N,N-dimethylacetamide (DMA), N-methylpyrrolidone, tetrahydrofuran, anisole, dichloromethane, dichloroethane, chloroform, carbon tetrachloride, chlorobenzene, dichlorobenzene, benzene, toluene, xylene, ethyl benzene, mesitylene, tetralin and methylnaphthalene.

Fluorine-containing aprotic solvents such as polyfluoro aromatic compounds like 4-bis(trifluoromethyl)benzene, polyfluorotrialkylamine compounds like perfluorotributylamine, polyfluorocycloalkane compounds like perfluorodecalin, polyfluoro cyclic ether compounds like perfluoro (2-butyltetrahydrofuran), perfluoropolyether, polyfluoroalkane compounds and hydrofluoroethers (HFEs).

These solvents may be used alone or in combination of two or more. In addition to those mentioned above, a wide variety of other compounds may be used.

Among them, fluorine-containing aprotic solvents are preferably used to dissolve the polymer (II) because the solubilities of the polymer (II) in them are high, and they are good solvents for the polymer (II).

As the solvent, a solvent which dissolves the adherend made of the polymer (I) is preferably used to achieve higher adhesiveness between the adherend and the adhesive joint.

A solvent having a boiling point from 65 to 220° C., particularly from 70 to 220° C. is preferred to make an even coating of the adhesive (1).

The content of the solvent is adjusted according to the solid content of the adhesive (A).
(Preparation of the Adhesive (A))

The adhesive material (A) is prepared by mixing the polymer (II) or its solution with other components, a solvent and the like, if necessary.

The polymer (II) or its solution may be a commercially available product, if it is appropriate, or may be prepared by an appropriate method such as polymerization from various starting compounds, for example, in accordance with Japanese Patent No. 2526841.
(Adhesive (B))

The adhesive (B) comprises a fluoropolymer having a fluorine-containing alicyclic structure (the polymer in the adhesive (B) is hereinafter referred to as the "polymer (III)") and an ultraviolet-shielding agent. The ultraviolet-shielding agent in the adhesive (B) prevents deterioration or decomposition of the polymer (III) due to exposure to ultraviolet light having a wavelength from 200 to 400 nm and accompanying decrease in adhesiveness. The adhesive (B) containing the polymer (III) and the ultraviolet-shielding agent forms an adhesive joint which holds together a member made of the polymer (I) to be used for a ultraviolet-light-emitting device using ultraviolet light having a wavelength from 200 to 400 nm as the light source and another member made of another material or the polymer (I) with excellent adhesiveness, and the adhesiveness is unlikely to impaired by exposure to ultraviolet light having a wavelength from 200 to 400 nm and high temperatures (for example, from 50 to 90° C.) and has excellent light and heat resistance.

The reason why the above-mentioned effect is produced is that the polymer (III) having a fluorine-containing alicyclic structure has high affinity for the surface of an adherend made of the polymer (I), and the ultraviolet-shielding agent prevents decomposition of the main chain and the reactive functional group of the polymer (III) by ultraviolet light by absorbing and/or reflecting ultraviolet light having a wavelength from 200 to 400 nm from the light source of the ultraviolet-light-emitting device and thereby reducing the amount of ultraviolet light which reaches the polymer (III).

The adhesive (B) may further contain components other than the polymer (III) and the ultraviolet-shielding agent if necessary.

The adhesive (B) may further contain a solvent, if necessary.

(Polymer (III))

The polymer (III) has a fluorine-containing alicyclic structure.

When the polymer (III) has a reactive functional group, the rest of the polymer (III) is preferably a perfluoropolymer.

The fluorine-containing alicyclic structure is similar to the fluorine-containing alicyclic structure in the unit (a) in the polymer (II).

The polymer (III) is, for example, a fluoropolymer having the previously mentioned unit (a). The unit (a) preferably has the fluorine-containing alicyclic structure in the main chain and is preferably formed by cyclization polymerization of a fluorine-containing diene monomer or derived from a fluorine-containing cyclic monomer.

As the fluorine-containing diene monomer or the Fluorine-containing cyclic monomer and preferred examples thereof, those mentioned for the units (a) may be mentioned.

The polymer (III) may contain other units such as the above-mentioned units (b) and (c), in addition to the unit (a).

When the polymer (III) contains a unit formed by cyclization polymerization of a fluorine-containing diene monomer as the unit (a), the proportion of the unit (a) to all units constituting the polymer (III) is preferably at least 50 mol %, more preferably at least 75 mol %, particularly preferably 100 mol %.

When the polymer (III) contains a unit derived from a fluorine-containing cyclic monomer, the proportion of the unit (a) to all units constituting the polymer (III) is preferably at least 20 mol %, more preferably at least 40 mol %, particularly preferably 100 mol %.

A polymer obtained by copolymerization of a fluorine-containing diene monomer and a fluorine-containing cyclic monomer is classified as a polymer having a unit derived from a fluorine-containing cyclic monomer.

The polymer (III) preferably has a reactive functional group.

When the adhesive (B) is used to bond an adherend made of the polymer (I) and an adherend made of a material other than the polymer (I), or when the polymer (I) has a functional group, a reactive functional group in the polymer (III) reacts with reactive functional groups in the other material or the polymer (I) to produce higher adhesiveness. The ultraviolet-shielding agent in the adhesive (B) prevents decomposition of the functional group by ultraviolet light and helps prolong the effect of the reactive functional group.

As the reactive functional group, those mentioned previously may be mentioned.

The reactive functional group is preferably at least one member selected from the group consisting of a carboxyl group, an acid halide group, an alkoxycarbonyl group, a carbonyloxy group, a carbonate group, a sulfo group, a phosphono group, a hydroxy group, a thiol group and a silanol group, and particularly preferably a carboxy group or an alkoxycarbonyl group.

The reactive functional group may be boned at the end of the main chain or in a side chain of the polymer (III), if the polymer (III) has the functional group in a side chain, the polymer (III) preferably contains the unit (b) previously mentioned for the polymer (II). In such a case, the total content of the units (a) and (b) is preferably within the same range as that mentioned as preferable for the polymer (II).

The polymer (III) preferably has a functional group at an end of the main chain for the sake of easy production. When the polymer (III) has a functional group at an end of the main chain, the polymer (III) is preferably produced by using a compound having the functional group as a polymerization initiator or a chain transfer agent.

The polymer (III) is preferably a polymer having a reactive functional group and containing a unit formed by cyclization polymerization of a fluorine-containing diene monomer particularly preferably a polymer consisting of units formed by cyclization polymerization of a fluorine-containing diene monomer and having a reactive functional group at an end of the main chain.

The $T_g$ of the polymer (III) is preferably from 30 to 180° C. in view of tacking property and anchoring effect, it is more preferably from 30 to 100° C., further preferably from 40 to 95° C., particularly preferably from 80 to 90° C.

(Ultraviolet-Shielding Agent)

An ultraviolet-shielding agent is an additive capable of absorbing and/or reflecting ultraviolet light.

The ultraviolet-shielding agent may be any conventional one without particular restrictions. To impart excellent storage stability to the adhesive, at least one type selected from inorganic particles and organic particles is preferred.

When the ultraviolet-shielding agent is at least one type selected from inorganic particles and organic particles, the average particle diameter of the ultraviolet-shielding agent is preferably from 0.01 to 5 μm, particularly preferably from 0.01 to 3 μm.

As the inorganic particles, metal particles, metal oxide particles, metal nitride particles, metal carbide particles, allotropes of carbon, glass particles, ceramics particles, double oxide particles and the like may be mentioned. Specific examples include Al particles, AlN particles, $Al_2O_3$ particles, Ag particles, Au particles, BN particles, $BaTiO_3$ particles, $Bi_2O_3$ particles, $CeO_2$ particles, CoO particles, Cr particles, $CrO_3$ particles, Cu particles, CuO particles, $Dy_2O_3$ particles, $Er_2O_3$ particles, $Eu_2O_3$ particles. Fe particles, $Fe_2O_3$ particles, $Fe_2O_3$ particles, $Gd_2O_3$ particles, $Ho_2O_3$ particles, $In_2O_3$ particles, ITO particles, $La_2O_3$ particles, $Lu_2O_3$ particles, MgO particles, $Mn_3O_4$ particles, Mo particles, $Nd_2O_3$ particles, Ni particles, NiO particles, Pd particles, $Pr_6O_{11}$ particles, Pt particles, $Sc_2O_3$ particles, Si particles, SiC particles, $Si_3N_4$ particles, $SiO_2$ particles, $Sm_2O_3$ particles, Sn particles, $SnO_2$ particles, $SrTiO_3$ particles, Ta particles, $Tb_4O_7$ particles, Ti particles, TiC particles, TiN particles, $TiO_2$ particles, $Tm_2O_3$ particles, W particles, WC particles, $Y_2O_3$ particles, $Yb_2O_3$ particles, Zn particles, ZnO particles, ZrC particles, $ZrO_2$ particles, cobalt blue, carbon black, carbon nanofiber, grapheme, fullerene, zeolite and the like.

As the organic particles, resin particles and the like may be mentioned. Specific examples include polytetrafluoroethylene (PTFE) particles, polyphenylene sulfide particles, polyamide imide particles, polyether sulfone particles, epoxy particles, nylon particles, polymethacrylic acid ester particles and the like.

These kinds of particles may be used in alone or in combination of two or more.

Among those mentioned above, carbon black, PTFE particles, $TiO_2$ particles, $SiO_2$ particles, ZnO particles and $ZrO_2$ particles are preferred.

The content of the ultraviolet-shielding agent in the adhesive (B) differs depending on the kind of the ultraviolet-shielding agent, but is preferably from 0.1 to 20 mass %, more preferably from 0.1 to 15 mass %, particularly preferably from 0.1 to 10 mass %, based on the polymer (III). When the content of the ultraviolet-shielding agent is at or above the lower limit of the above-mentioned range, the adhesive joint has excellent light resistance. When the content of the ultraviolet-shielding agents at or below the upper limit of the above-mentioned range, the adhesive joint shows excellent initial adhesiveness, and the adhesive shows excellent surface leveling property.

The total content of the polymer (III) and the ultraviolet-shielding agent in the material (B) is preferably at least 50 mass %, more preferably at least 70 mass %, particularly preferably at least 80 mass %, based on the solid in the adhesive (B). When the total content of the polymer (III) and the ultraviolet-shielding agent is at or above the lower limit of the above-mentioned range, the adhesiveness between the adherends and the adhesive joint is excellent.

The upper limit of the total content of the polymer (III) and the ultraviolet-shielding agent based on the solid in the adhesive (B) may be 100 mass % without particular restrictions. It can be set appropriately depending on the content of other optional components.

The solid in the adhesive (B) means the polymer (III) plus the ultraviolet-shielding agent.

(Other Components)

As other components, those mentioned for the first embodiment may be mentioned.

The content of other components in the adhesive (B) may be adjusted arbitrarily according to their types, as long as they do not spoil the effect of the present invention.

(Solvent)

A solvent which dissolves at least the polymer (II) is used in the adhesive (B). The solvent be used to dissolve the polymer (III) may serve as a dispersion medium for the ultraviolet-shielding agent.

As the solvent and preferred examples thereof, those mentioned for the first embodiment may be mentioned.

The content of the solvent is adjusted according to the solid content of the adhesive (B).

The solid content of the adhesive (B) may be arbitrarily adjusted according to the coating method, the thickness of the coating to be formed and the like, and is preferably from 1 to 30 mass %, particularly preferably from 1 to 20 mass %.

(Adhesive (B))

The adhesive (B) is prepared by mixing the polymer or its solution and the ultraviolet-shielding agent with other components, a solvent and the like, if necessary.

The polymer (III) or its solution may be a commercially available product, if appropriate, or may be prepared by an appropriate method such as polymerization from various starting compounds, for example, in accordance with Japanese Patent No. 2526841.

[Ultraviolet-Light-Emitting Device]

FIG. 1 is a schematic sectional view of an embodiment of the ultraviolet-light-emitting device of the present invention.

The illustrated ultraviolet-light-emitting device 10 comprises a light-emitting element 1, a lens (optical member) 9 made of the polymer (I) and an adhesive joint 11 holding together the light-emitting element 1 and the lens 9.

The light-emitting element 1 comprises a substrate 3, a LED die 5 which emits ultraviolet light having a wavelength from 200 to 400 nm and a support frame 7.

The LED die 5 is mounted on the surface of the substrate 3.

The support frame 7 is placed on the substrate 3 so as to surround the LED die.

The lens 9 is placed above the LED die 5 so as to close the opening of the support frame.

The ultraviolet-light-emitting device 10 has space S defined by the substrate 3, the support frame 7 and the lens 9 to accommodate the LED die 5.

The substrate 3 may be a printed-wiring board, a lead frame or the like.

The ultraviolet light emitted by the LED die 5 has a wavelength from 200 to 400 nm, preferably from 200 to 370 nm. The shorter the wavelength of the ultraviolet light, the more useful the present invention.

As the material for the LED die 5, GaAs, AlN, AlGaN, AlInGaN or the like may be mentioned.

The support frame 7 has a side wall 7a and a ceiling 7b. In the ceiling 7b, an opening 7c is formed. A groove 7d is cut in the inner surface of the side wall along the upper edge of the side wall. In the groove 7d, the adhesive joint 11 is formed.

As the material for the support frame 7, an alloy such as Kovar (a Ni—Co alloy), a Cu—Zn copper alloy, a Cu—Fe copper alloy or stainless steel, a metal such as Cu, Al, Ni, a ceramic such as alumina, glass or the like may be mentioned. Among them, an alloy, a ceramic or Al is preferred in view of their light weight and high durability.

The lens 9 consists of a bullet-shaped lens body 9a having a domical top and a planar bottom and a brim 9b stretching all around the bottom of the lens body 9a.

The width of the brim 9b (perpendicular to the surface of the substrate 3) is about the same as the width of the groove 7d in the support frame.

The lens body 9a is designed to be the same as or slightly smaller than the opening 7c in the support frame 7 in diameter, and the brim 9b is designed to have a diameter larger than the opening 7c in the support frame 7 and smaller than the inner diameter of the side wall 7a so that when the lens 9 is mounted upward in the opening 7c in the support frame 7, the upper side of the brim 9b comes into contact with the lower side of the ceiling 7b.

The lens 9 is in contact with the adhesive joint 11 along the edge of the brim 9b and held to the support frame 7 by the adhesive joint 11.

In this embodiment, the adhesive joint 11 is made of the adhesive of the present invention.

For example, the ultraviolet-light-emitting device 10 is obtained by the following procedure. First, the adhesive is applied in the groove 7d in the support frame 7 and, if necessary, dried. Then, the lens 9 is inserted in the opening 7c in the support frame 7 upward so that the brim 9b comes into contact with the dried adhesive, and they are baked while kept in this state. Upon the baking, the dried adhesive turns into the adhesive joint 11, and the lens 9 adheres to the support frame 7 through it. Then, the support frame 7 bonded to the lens 9 is mounted on the substrate 3 equipped with the LED die 5 to make the ultraviolet-light-emitting device 10.

The adhesive may be applied by any known coating method such as spin coating, potting, ink jet printing or spraying without particular restrictions.

After the application, the adhesive is dried by any drying method such as heating, vacuum desiccation or vacuum desiccation under heating.

The baking temperature for bonding the support frame 7 to the lens 9 is typically the $T_g$ of the polymer in the adhesive or above, preferably the $T_g^I$ or the $T_g$ of the polymer in the adhesive, whichever is the higher, or above, and particularly preferably higher by at least 50° C. than the $T_g^I$ or the $T_g$ of the polymer in the adhesive, whichever is the higher.

The upper limit of the baking temperature is not particularly restricted, but it is preferably a temperature higher by 100° C. than the $T_g^I$ or the $T_g$ of the polymer in the adhesive, whichever is the higher, particularly preferably a temperature higher by 80° C. than the $T_g^I$ or the $T_g$ of the polymer in the adhesive, whichever is the higher, with a view to preventing deterioration of the lens 9.

Figure 2:
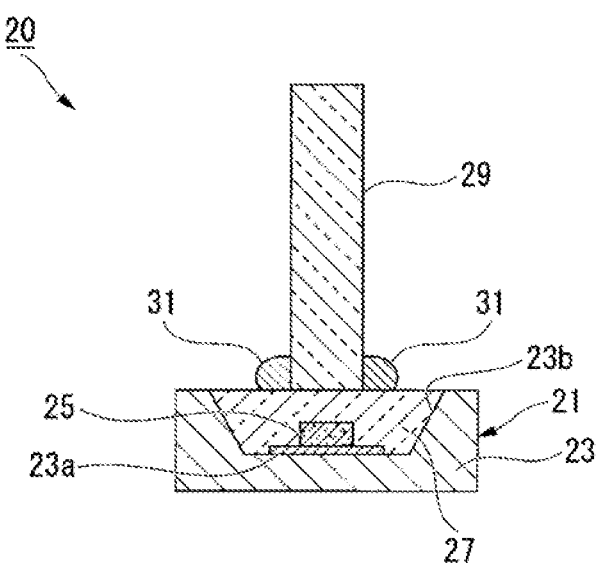
FIG. 2 A schematic sectional view of another embodiment of the ultraviolet-light-emitting device of the present invention.

FIG. 2 is a schematic sectional view of another embodiment of the ultraviolet-light-emitting device of the present invention.

The illustrated ultraviolet-light-emitting device 20 comprises a light-emitting element 21, an optical fiber (optical member) 29 and an adhesive joint 31 holding together the light-emitting element 21 and the optical fiber 29.

The light-emitting element 21 comprises a substrate 23, a LED die 25 which emits ultraviolet light having a wavelength from 200 to 400 nm and a sealing 27 made of the polymer (I).

The substrate 23 has wiring 23a for the LED die 25 to be mounted on and a dent 23b, and the wiring 23a is formed on the bottom of the dent 23b, which has the LED die 25 on the bottom and filled with the sealing 27. The top of the light-emitting element 21 is leveled with the sealing 27. Onto the sealing 27 on the light-emitting element 21, the optical fiber 29 is fixed by the adhesive joint 31.

As the material for the substrate 23, Kovar, Al, a ceramic or the like may be mentioned.

As the material for the wiring 23a, Au, Ag, Al, Cu or the like may be mentioned.

The LED die 25 is similar to the above-mentioned LED die 5.

As the material for the optical fiber 29, quartz, sapphire, a perfluoro fluorine-containing resin (such as the one in CTX-809S (trade name, manufactured by Asahi Glass Company, Limited, used in the Examples) may be mentioned.

The optical fiber 29 is placed on the sealing 27 in the light-emitting element 21, and the adhesive of the present invention is applied around the lower end of the optical fiber 29, and if necessary, dried. Then, they are baked to bond the sealing 27 and the optical fiber 29, and thus the ultraviolet-light-emitting device 20 is obtained.

The methods for applying and drying the adhesive and the preferred baking temperature are the same as previously mentioned.

Figure 3:
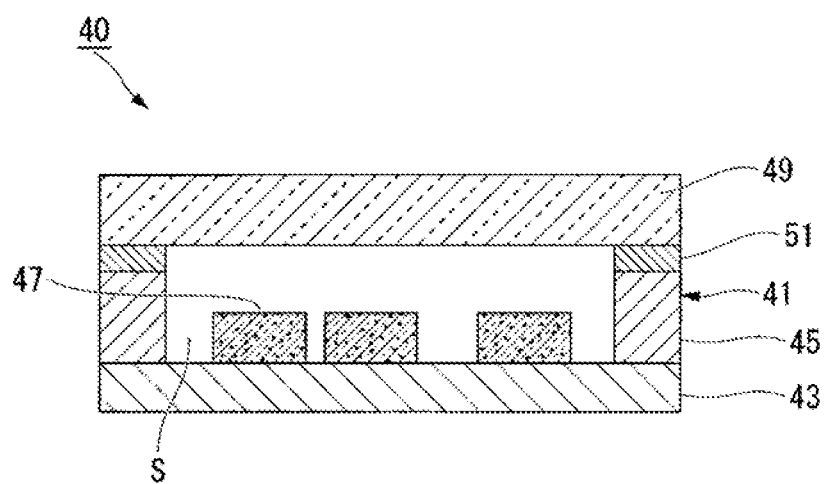
FIG. 3 A schematic sectional view of still another embodiment of the ultraviolet-light-emitting device of the present invention.

FIG. 3 is a schematic sectional view of still another embodiment of the ultraviolet-light-emitting device of the present invention.

The illustrated ultraviolet-light-emitting device 40 comprises a light-emitting element 41, a flat transparent pane (optical member) 49 and an adhesive joint which holds together the light-emitting element 41 and the transparent pane 40.

The light-emitting element 41 comprises a substrate 43, a frame 45 and a plurality of LED dies 47 which emit ultraviolet light having a wavelength from 200 to 400 nm.

The LED dies 47 are mounted on the surface of the substrate 43. The frame 45 is placed on the substrate 43 so as to surround the LED dies 47. The adhesive joint 51 is formed on the upper edge of the frame 45. The transparent pane 49 is placed on the frame 45 so as to close the opening of the frame 45. The frame 45 is taller than the LED dies 47, and the transparent pane 49 is above the LED dies 47.

The ultraviolet-light-emitting device 40 has space S defined by the substrate 43, the frame 45 and the transparent pane 49 to accommodate the LED dies 47.

As the material for the substrate 43 and the frame 45, Al, silicon, a ceramic, SiC, GaN, glass, tungsten, molybdenum, sapphire or the like may be mentioned. The substrate 43 and the frame 45 may be made of the same material or different materials.

The LED dies 47 are similar to the previously mentioned LED die 5.

The adhesive of the present invention is applied to the upper surface of the light-emitting element 41 and, if necessary, dried. Then, the transparent pane 49 is placed on the frame 45, and they are baked while kept in contact with the dried adhesive. Upon the baking, the dried adhesive turns into the adhesive joint 51 which holds the frame 45 and the transparent pane 49 together, and thus, the ultraviolet-light-emitting device 40 is obtained.

The methods for applying and drying the adhesive and the preferred baking temperature are the same as previously mentioned.

The ultraviolet-light-emitting device of the present invention is by no means limited to the above-mentioned embodiments. The constituents of the above-mentioned embodiments and their combinations are mere examples, and addition, omission, replacement and other modifications of constituents may be possible without departing from the scope of the present invention.

The ultraviolet-light-emitting device is not limited to those illustrated in FIGS. 1 to 3.

The shapes of the lens, the optical fiber and the transparent pane as optical members are not limited to those mentioned above.

The light-emitting element may be an LED element different from the light-emitting elements 1, 21 and 41.

(Polymer (I) Forming the Light-Emitting Element and the Optical Member)

The polymer (I) is preferably a fluoropolymer having a fluorine-containing alicyclic structure.

When the polymer (I) has a reactive functional group, it is preferred that the rest of the polymer (I) is a perfluoropolymer.

The fluorine-containing alicyclic structure is similar to that of the unit (a) in the polymer (II).

As the polymer (I), a polymer having the unit (a) previously mentioned. As the unit (a), a unit having a fluorine-containing alicyclic structure in the main chain is preferred, and a unit formed by cyclization polymerization of a fluorine-containing diene monomer or derived from a cyclic fluorine-containing monomer is particularly preferred.

The fluorine-containing diene monomer and the cyclic fluorine-containing monomer and their preferred embodiments are slimier to those mentioned previously for the unit (a).

The polymer (I) may contain the previously mentioned units (b) and (c) in addition to the unit (a).

When the unit (a) is formed by cyclization polymerization of a fluorine-containing diene monomer, the proportion of the unit (a) is preferably at least 50 mol %, more preferably at least 75 mol %, particularly preferably 100 mol %, based on all the units constituting the polymer (I).

When the unit (a) is derived from a cyclic fluorine-containing monomer, the proportion of the unit (a) is preferably at least 20 mol %, more preferably at least 40 mol %, particularly preferably 100 mol %, based on all the units constituting the polymer (I).

The polymer (I) may have a reactive functional group or may have no reactive functional groups. As the reactive functional group, those previously mentioned may be mentioned.

When the polymer (I) has a reactive functional group, the reactive functional group may be bonded to an end of the main chain of the polymer (I) or in the side chain.

In view of transparency to ultraviolet light having a wavelength from 200 to 400 nm and light resistance, the polymer (I) is preferred to have no reactive functional groups. Therefore, if is preferred to have neither the unit (b) nor (c) mentioned above and have terminal groups other than reactive functional groups (such as trifluoromethyl groups) at the ends of the main chain.

The $T_g$ of the polymer (I) is preferably at least 90° C., particularly preferably from 100 to 180° C. The combination of the optical element and the adhesive joint in the ultraviolet-light-emitting device of the present invention is such that the polymer (I) has a higher $T_g$ than the polymer (II).

The light-emitting element having a part made of the polymer (I) and the optical member made of the polymer (I) may be commercially available products, if appropriate, or may be prepared by using the polymer (I). The polymer (I) may be a commercially available product, if appropriate, or may be prepared by an appropriate method such as polymerization from various starting compounds, for example, in accordance with Japanese Patent No. 2526641. A commercial product available as the polymer (I) is CYTOP (registered trademark, Asahi Glass Company, Limited) or the like.

EXAMPLES

Now, the present invention will be described by reference to Examples. However, the present invention is by no means restricted thereto.

Among Examples 1 to 10 described below, Examples 3, 5 to 8 and 8 to 10 are Working Examples, Examples 1 to 2 and 4 are Comparative Examples, and Example 7 is a Reference Example.

The following materials and evaluation methods were used in these Examples.

(Materials)

Optical member (1): 200-μm thick press-molded film of the following fluoropolymer (1)

Fluoropolymer (1): homopolymer having a $CF_3$-terminated main chain obtained by cyclization polymerization of perfluoro(3-butenyl vinyl ether) (hereinafter referred to as "BVE")

The fluoropolymer (1) was obtained by removing the solvent from CTX-809S (product name, manufactured by Asahi Glass Company, Limited)

Optical member (2): 200-μm thick press-molded film of the following fluoropolymer (2)

Fluoropolymer (2): homopolymer having a COOH-terminated main chain obtained by cyclization polymerization of perfluoroallyl vinyl ether (hereinafter referred to as "AVE")

The fluoropolymer (2) was obtained by cyclization polymerization of AVE in accordance with Japanese Patent No. 2528841 followed by heat treatment in accordance with WO2010/032759 and hydrolysis of the terminal groups into COOH.

Optical member (3): 200-μm thick press-molded film of the following fluoropolymer (3)

Fluoropolymer (3): Teflon (registered trademark) AF1600 which is a copolymer of 2,2-bistrifluoromethyl-4,5-difluoro-1,3-dioxole and tetrafluoroethylene, obtained by removing the solvent from Teflon (registered trademark) AF1600S (manufactured by Du Pont-Mitsui Fluorochemicals Co., Ltd.) which is a solution of Teflon (registered trademark) AF1600 in a solvent.

The light transmittances of the optical members (1) to (3) at a wavelength from 200 to 400 nm measured with a spectrometer UV-3100 (manufactured by Shimadzu Corporation) were as high as at least 80%.

(Evaluation Methods)

Glass Transition Temperature ($T_g$):

Midway glass transition temperature measured in accordance with JIS K 7121: 2012 edition.

Preparation of Specimens:

A 3 cm square substrate (made of Kovar) was set on a spin coater, and 0.5 mL of an adhesive was dropped onto the surface of the substrate rotating at 1,000 rpm and then baked at 150° C. for 1 hour to form a dry coating. Then, an optical member cut into a 2-cm square was placed on the dry coating and baked at 150° C. for 2 hours to obtain a specimen having a layer structure of substrate/adhesive joint/optical member.

Initial Adhesiveness (Cross-Cut Test):

A grid comprising twenty-five 2 mm×2 mm squares was cut in the optical member of a specimen (substrate/adhesive joint/optical member) with a cutter by using a cross cut guide CCI-2 manufactured by Cotec Corp. Then, Cellotape (registered trademark) (manufactured by NICHIBAN CO., LTD., model: CT-18) was stuck onto the optical member and peeled from it repeatedly 10 times. The surface of the specimen was observed under an optical microscope at 20-fold magnification, and the number of cells which had not peeled off among the 25 squares were counted.

The specimen was rated as O (good) when retaining 20 or more squares, or as x (poor) when retaining less than 20 squares.

Light Resistance:

A low pressure mercury vapor lamp having a fluorescent tube filtering out light having a wavelength of 185 nm (manufactured by USHIO INC., model: SUV-40L) was adjusted to an illuminance of 10 mW/cm$^2$, and the optical member surface of a specimen was exposed to ultraviolet light (wavelength 254 nm) for 200 hours. After the exposure, the adhesiveness was evaluated by the cross cut method in the same manner as the initial adhesiveness.

Heat Resistance:

A specimen was held upright and heated in an oven at 80° C. for 200 hours. Then, the specimen was checked for peeling or displacement of the optical member by naked eye.

The specimen was rated as O (good) when the optical member stayed in its initial position (the position before the heating) or as x (poor) when the optical member had peeled off or, even if it had not peeled off, slided more than 1 mm from the initial position.

Preparation Example 1

Adhesive (a) was obtained by diluting 3-aminopropyltrimethoxysilane with ethanol to a concentration of 0.1 mass %.

Preparation Example 2

Perfluorotributylamine was added to CTL-809A (product name, manufactured by Asahi Glass Company, Limited) to obtain a solution containing 4 mass % of fluoropolymer (4) to be used as Adhesive (b). The fluoropolymer (4) is a homopolymer so having a COOH-terminated main chain obtained by cyclization polymerization of BVE like the previously mentioned fluoropolymer (2) and had a $T_g$ of 108° C.

Preparation Example 3

A fluoropolymer (5) was prepared by the procedure described below by reference to Example 11 of Japanese Patent No. 2528641.

24.5 g of BVE, 3 g of $CF_2CF$—$OCF_2CF_2CF_2COOCH_3$ (hereinafter referred to as "MXM") and 0.04 g of PEROYL IPP (product name, manufactured by NOF CORPORATION) as a polymerization initiator were charged into an ampoule and allowed to react at 40° C. for 24 hours to obtain the fluoropolymer (5), which contained the unit formed by cyclization polymerization of BVE and the unit derived from MXM in a ratio of 9/1 (molar ratio) and had a $T_g$ of 73° C.

The resulting fluoropolymer (5) was dissolved in perfluorotributylamine to a concentration of 4 mass % to obtain Adhesive (c).

Preparation Example 4

The reaction in Example 1 was carried out in the same manner except that the amount of BVE was changed to 7.9 g, and the amount of MXM was changed to 13 g to obtain a fluoropolymer (6), which contained the unit formed by cyclization polymerization of BVE and the unit derived from MXM in a ratio of 4/6 (molar ratio) and had a $T_g$ of 10° C.

The resulting fluoropolymer (b) were dissolved in perfluorotributylamine to a concentration of 4 mass % to obtain Adhesive (d).

Preparation Example 5

Carbon black (manufactured by Mitsubishi Chemical Corporation, product ID: MA-600) was dispersed in the solution obtained in Preparation Example 2 to a 7 mass % based on the fluoropolymer to obtain Adhesive (e).

Preparation Example 6

The fluoropolymer (2) was dissolved in perfluorotributylamine to a concentration of 4 mass % to obtain Adhesive (f).

Preparation Example 7

PTFE fine particles (manufactured by Asahi Glass Company, Limited, product ID: L170A) were dispersed in the solution obtained in Preparation Example 2 to a 7 mass % based on the fluoropolymer to obtain Adhesive (g).

Preparation Example 8

$TiO_2$ fine particles (manufactured by SAKAI CHEMICAL INDUSTRY CO., LTD., product ID: D-2667) were dispersed in the solution obtained in Preparation Example 2 to a 7 mass % based on the fluoropolymer to obtain Adhesive (h).

Preparation Example 9

100 g of BVE, 0.5 g of methanol as a chain transfer agent and 0.7 g of PEROYL IPP (product name, manufactured by NOF CORPORATION) as a polymerization initiator were sealed into an autoclave (made of pressure-resistant glass) end reacted in the autoclave at 40° C. for 22 hours to obtain a polymer by cyclization polymerization of BVE, which had an intrinsic viscosity of 0.2 dl/g in perfluoro (2-butyltetrahydrofuran) at 30° C. Then, the polymer was treated with heat at 300° C. in an atmosphere of air, then immersed in methanol at 80° C. for 20 hours and dried in vacuo at 100° C. for 24 hours to obtain a fluoropolymer (7). The fluoropolymer had a $COOCH_3$-terminated main chain (confirmed by IR spectrometry) and a $T_g$ of 108° C.

The fluoropolymer (7) was dissolved in perfluorotributylamine to a concentration of 4 mass %, and further, carbon black (manufactured by Mitsubishi Chemical Corporation, product ID: MA-600) was dispersed to a 7 mass % relative to the fluoropolymer to obtain Adhesive (i).

Examples 1 to 10

Specimens were prepared by using the adhesives obtained in the respective Preparation Examples, and initial adhesiveness, light resistance and heat resistance were evaluated. The results are shown in Table 1 together with the types of the optical members used for preparation of specimens and the $T_g$ of the fluoropolymer constituting the optical members.

Example 1 was evaluated as x for initial adhesiveness and was not evaluated for light resistance or heat resistance.

TABLE 1

| | | Ex. 1 | Ex. 2 | Ex. 3 | Ex. 4 | Ex. 5 | Ex. 6 | Ex. 7 | Ex. 8 | Ex. 9 | Ex. 10 |
|---|---|---|---|---|---|---|---|---|---|---|---|
| Adhesive | Type | (a) | (b) | (c) | (d) | (e) | (e) | (f) | (g) | (h) | (i) |
| | $T_g$ (° C.) | — | 108 | 73 | 10 | 108 | 108 | 69 | 108 | 108 | 108 |
| | Ultraviolet-shielding agent | Nil | Nil | Nil | Nil | Contained (carbon black) | Contained (carbon black) | Nil | Contained (PTFE fine particles) | Contained ($TiO_2$ fine particles) | Contained (carbon black) |
| Optical member | Type | (1) | (1) | (1) | (1) | (2) | (3) | (1) | (1) | (1) | (1) |
| | $T_g$ (° C.) | 108 | 108 | 108 | 108 | 108 | 160 | 108 | 108 | 108 | 108 |
| Initial adhesiveness | Number of remaining cells (cells) | 5 | 25 | 25 | 25 | 25 | 25 | 25 | 25 | 25 | 25 |
| | Result | X | ○ | ○ | ○ | ○ | ○ | ○ | ○ | ○ | ○ |
| Light resistance | Number of remaining cells (cells) | — | 0 | 25 | 25 | 25 | 25 | 25 | 25 | 25 | 25 |
| | Result | — | X | ○ | ○ | ○ | ○ | ○ | ○ | ○ | ○ |
| Heat resistance | | — | ○ | ○ | X | ○ | ○ | ○ | ○ | ○ | ○ |

When adhesives of the present invention were used in Examples 3, 5 to 6 and 8 to 10, initial adhesiveness, light resistance and heat resistance were all excellent.

When a silane coupling agent usually used for improvement of adhesiveness was used in Example 1, initial adhesiveness was poor.

When a fluoropolymer having a $T_g$ higher than 100° C. in Example 2, light resistance was poor.

When a polymer having a $T_g$ of 10° C. in Example 4, heat resistance was poor.

The results of Examples 2 to 4 confirm that by changing the proportion of BVE to MXM, $T_g$ can be varied widely. For the AVE homopolymer used in Adhesive (f) in Example 7, the $T_g$ cannot be varied that way. The fact that the possible range of $T_g$ is wide is advantageous in broadening the choice for adherends.

REFERENCE SYMBOLS

1: Light-emitting element, 3: Substrate, 5: LED die, 7: Support frame, 7a: Side wall, 7b: Ceiling, 7c: Opening, 7d: Groove, 9: Lens (optical member), 9a: Lens body, 9b: Brim, 10: Ultraviolet-light-emitting device, 11: Adhesive joint, S: Space, 20: Ultraviolet-light-emitting device, 21: Light-emitting element, 23: Substrate, 23a: wiring, 23b: dent, 25: LED die, 27: Sealing, 29: Optical fiber (optical member), 31: Adhesive joint, 40: Ultraviolet-light-emitting device, 41: Light-emitting element, 43: Substrate, 45: Frame, 47: LED die, 49: Transparent pane (optical member), 51: Adhesive joint

What is claimed is:

1. An adhesive for forming an adhesive joint in an ultraviolet-light-emitting device, which is either the following adhesive (A) or the following adhesive (B) comprising a fluoropolymer having a fluorine-containing alicyclic structure:
   wherein:
   the ultraviolet-light-emitting device comprises a light-emitting element generating ultraviolet light having a wavelength of from 200 to 400 nm, an optical member which transmits the ultraviolet light generated by the light-emitting element and the adhesive joint formed from the adhesive between the light-emitting element and the optical member, wherein the optical member is made of a fluoropolymer having a fluorine-containing alicyclic structure;
   the adhesive (A) is an adhesive in which the glass transition temperature of the fluoropolymer is from 30 to 100° C., and which does not comprise an ultraviolet-shielding agent; and
   the adhesive (B) is an adhesive comprising the fluoropolymer and an ultraviolet-shielding agent.

2. The adhesive according to claim 1, which is the adhesive (B), wherein the glass transition temperature of the fluoropolymer in the adhesive (B) is from 30 to 100° C.

3. The adhesive according to claim 1, which is the adhesive (B), wherein the adhesive (B) comprises the ultraviolet-shielding agent in an amount of from 0.1 to 20 mass % based on the fluoropolymer.

4. The adhesive according to claim 1, wherein the ultraviolet-shielding agent comprises at least one kind selected from the group consisting of inorganic particles and organic particles.

5. The adhesive according to claim 1, wherein the fluoropolymer has a reactive functional group in a side chain or at the end of the main chain and has no hydrogen atoms bonded to a carbon atom anywhere other than the reactive functional group.

6. The adhesive according to claim 1, wherein the glass transition temperature of the fluoropolymer in the optical member is equal to or higher than the glass transition temperature of the fluoropolymer in the adhesive.

7. The adhesive according to claim 1, wherein the glass transition temperature of the fluoropolymer in the optical member is 100 to 180° C.

8. The adhesive according to claim 1, wherein the fluoropolymer having the fluorine-containing alicyclic structure has units (a) having the fluorine-containing alicyclic structure.

9. The adhesive according to claim 8, wherein at least one of the ring-constituting carbon atoms in the fluorine-containing alicyclic ring is in the polymer main chain.

10. The adhesive according to claim 8, wherein the units (a) have no hydrogen atoms bonded to a carbon atom.

11. The adhesive according to claim 8, wherein the unit (a) is formed by cyclization polymerization of a fluorine-containing diene monomer.

12. The adhesive according to claim 8, wherein the fluoropolymer having a glass transition temperature of from 30 to 100° C. comprises the units (a) and units (b) represented by the following formula (b), and the total content of the unit (a) and the units (b) is from 50 to 100 mol % based on the total of all units:

(wherein $R^f$ is a perfluoroalkylene group which may have an ethereal oxygen atom, X is COOH, COOR, $SO_2F$, $SO_3R$ or $SO_3H$, and R is a $C_{1-5}$ alkyl) group.

13. The ultraviolet-light-emitting device comprising the light-emitting element generating ultraviolet light having the wavelength of from 200 to 400 nm and the optical member which transmits ultraviolet light having the wavelength of from 200 to 400 nm, wherein the light-emitting element and the optical member are bonded together by the adhesive joint formed from the adhesive according to claim 1.

* * * * *